United States Patent [19]
Hoyt, III et al.

[11] Patent Number: 4,934,767
[45] Date of Patent: Jun. 19, 1990

[54] SEMICONDUCTOR WAFER CARRIER INPUT/OUTPUT DRAWER

[75] Inventors: Hazen L. Hoyt, III, Costa Mesa; Jon C. Goldman, Orange; William R. Mello, Huntington Beach, all of Calif.

[73] Assignee: Thermco Systems, Inc., San Jose, Calif.

[21] Appl. No.: 863,960

[22] Filed: May 16, 1986

[51] Int. Cl.$^5$ .............................................. A47F 3/00
[52] U.S. Cl. ................................... 312/330.1; 211/1.5; 312/319
[58] Field of Search ............... 312/286, 287, 289, 296, 312/330 R, 319; 211/79, 1.5, 151

[56] References Cited
U.S. PATENT DOCUMENTS

| | | | |
|---|---|---|---|
| 736,449 | 8/1903 | Shanklin et al. | 312/296 |
| 827,050 | 7/1906 | Weston | 211/79 |
| 1,137,073 | 4/1915 | Morris | 312/296 X |
| 3,730,358 | 5/1973 | Oji | 211/1.5 |
| 4,269,461 | 5/1981 | Roach | 312/111 X |

Primary Examiner—Joseph Falk
Attorney, Agent, or Firm—William B. Walker

[57] ABSTRACT

Plastic cassettes carrying semiconductor wafers are loaded into and/or unloaded from an extended open drawer. The drawer is retractable to a closed position in a frame where the cassettes may be removed from or returned to the drawer by a programmable elevator. The frame may have several drawers and cassettes may be safely loaded into or unloaded from the open drawer while cassettes are being removed from or returned to a closed drawer.

5 Claims, 6 Drawing Sheets

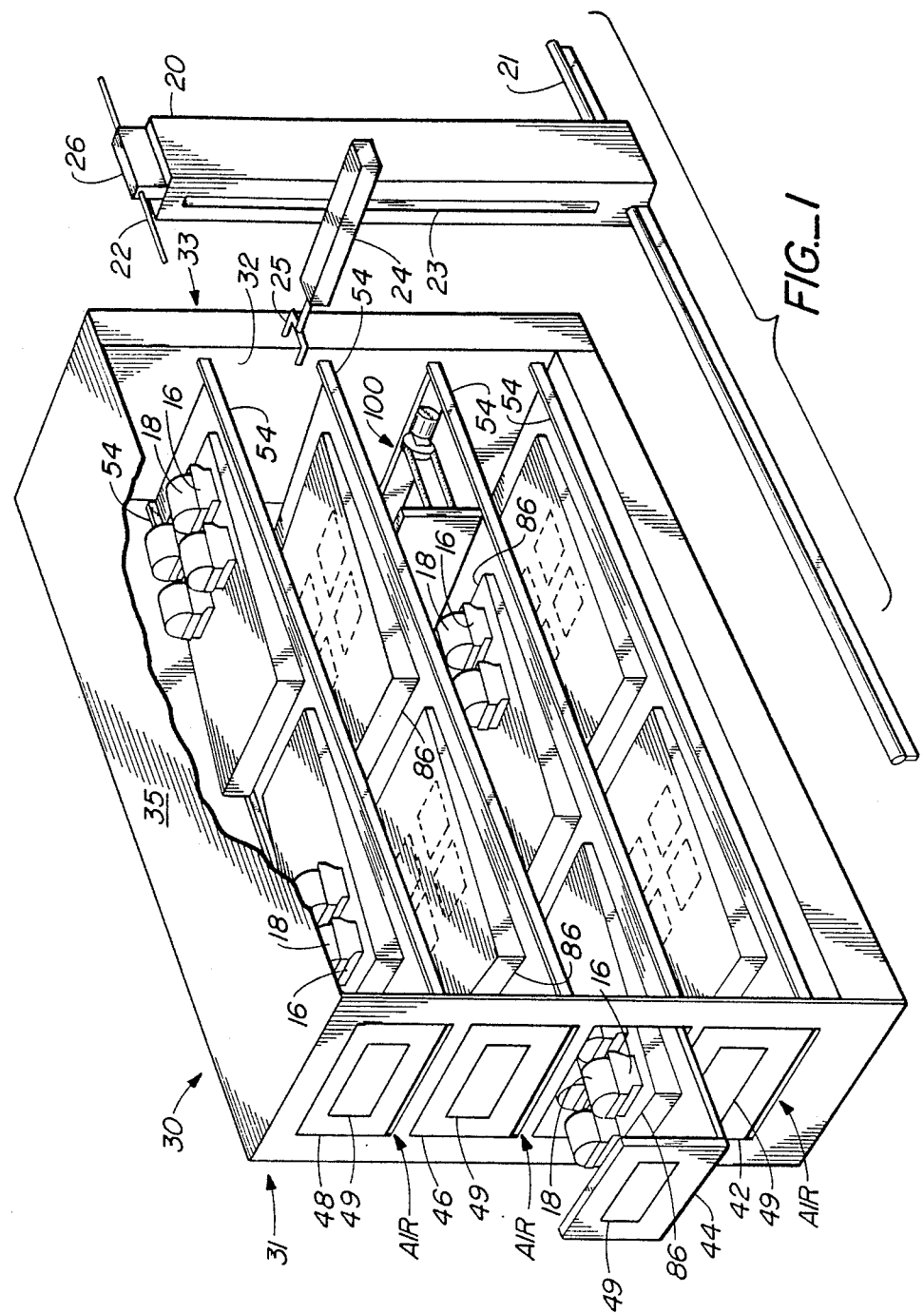
FIG.—1

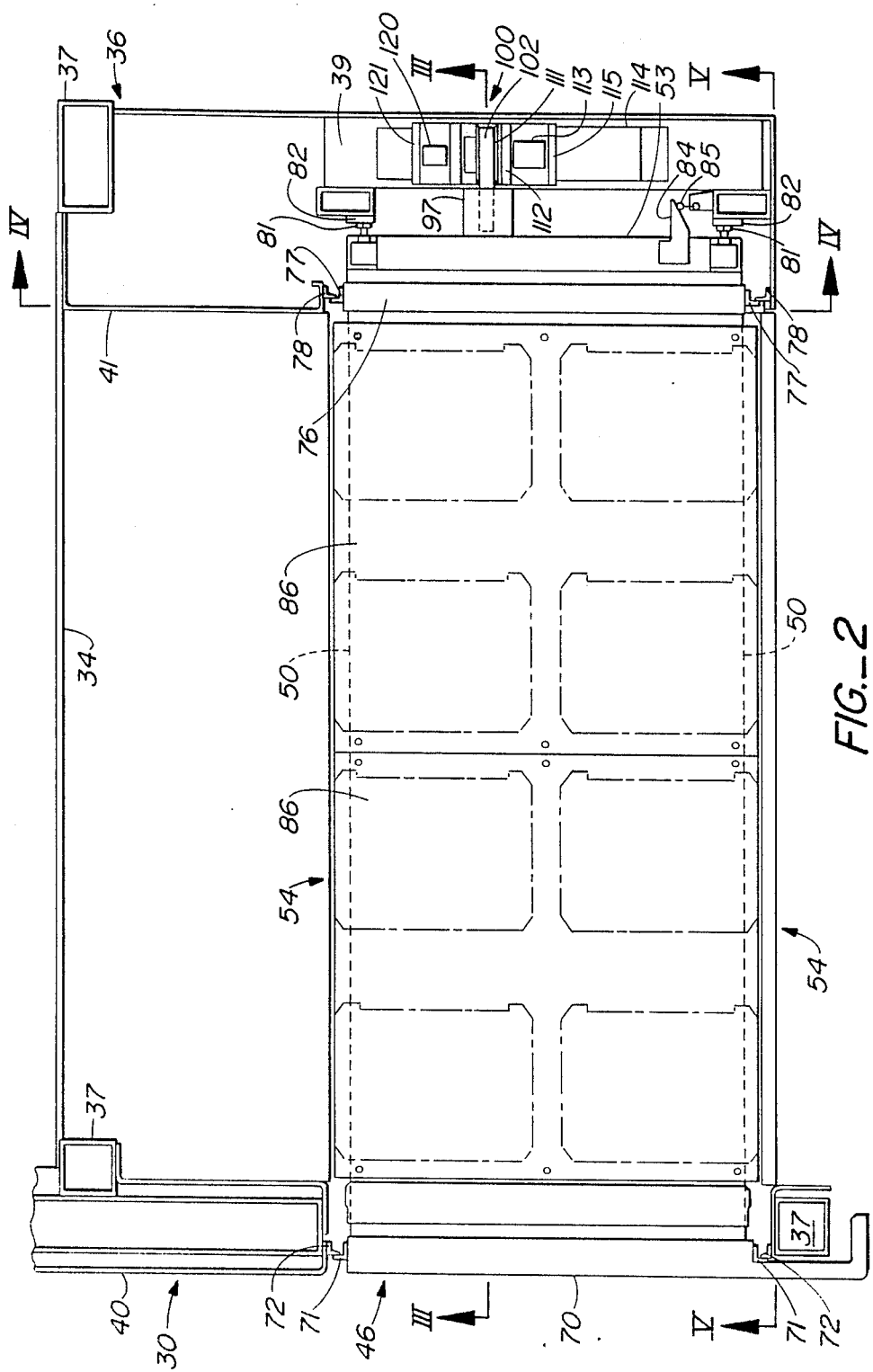
FIG._2

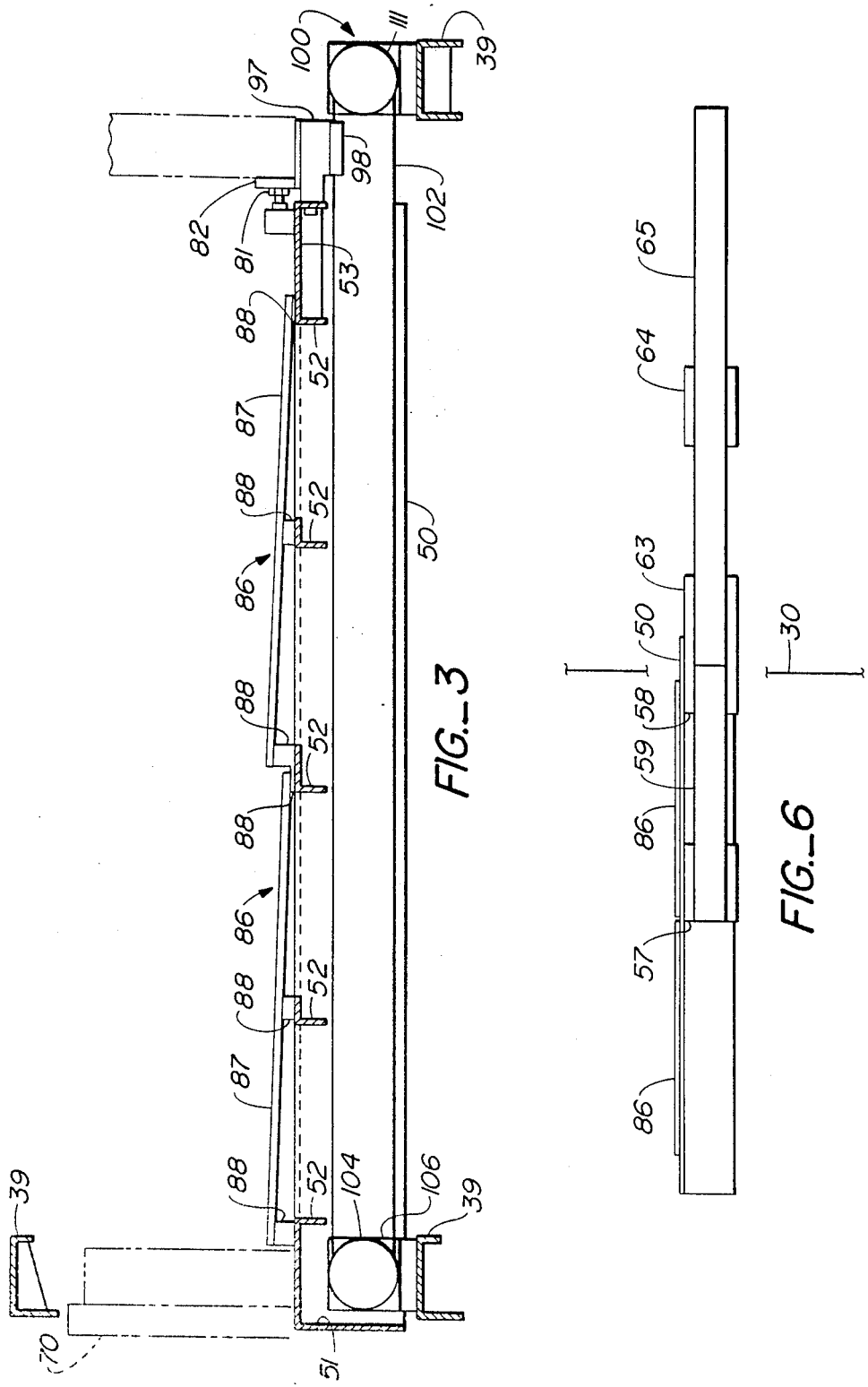

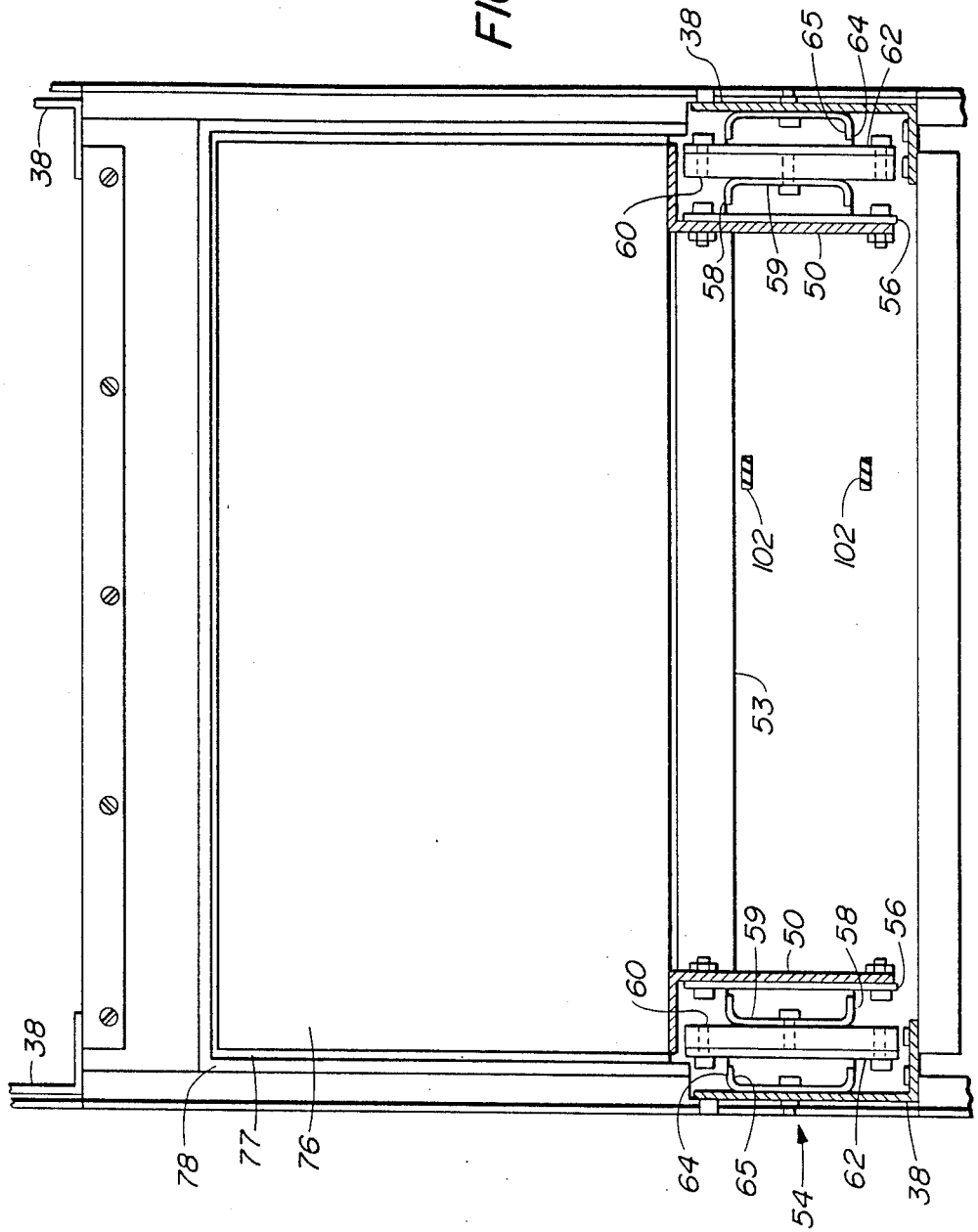

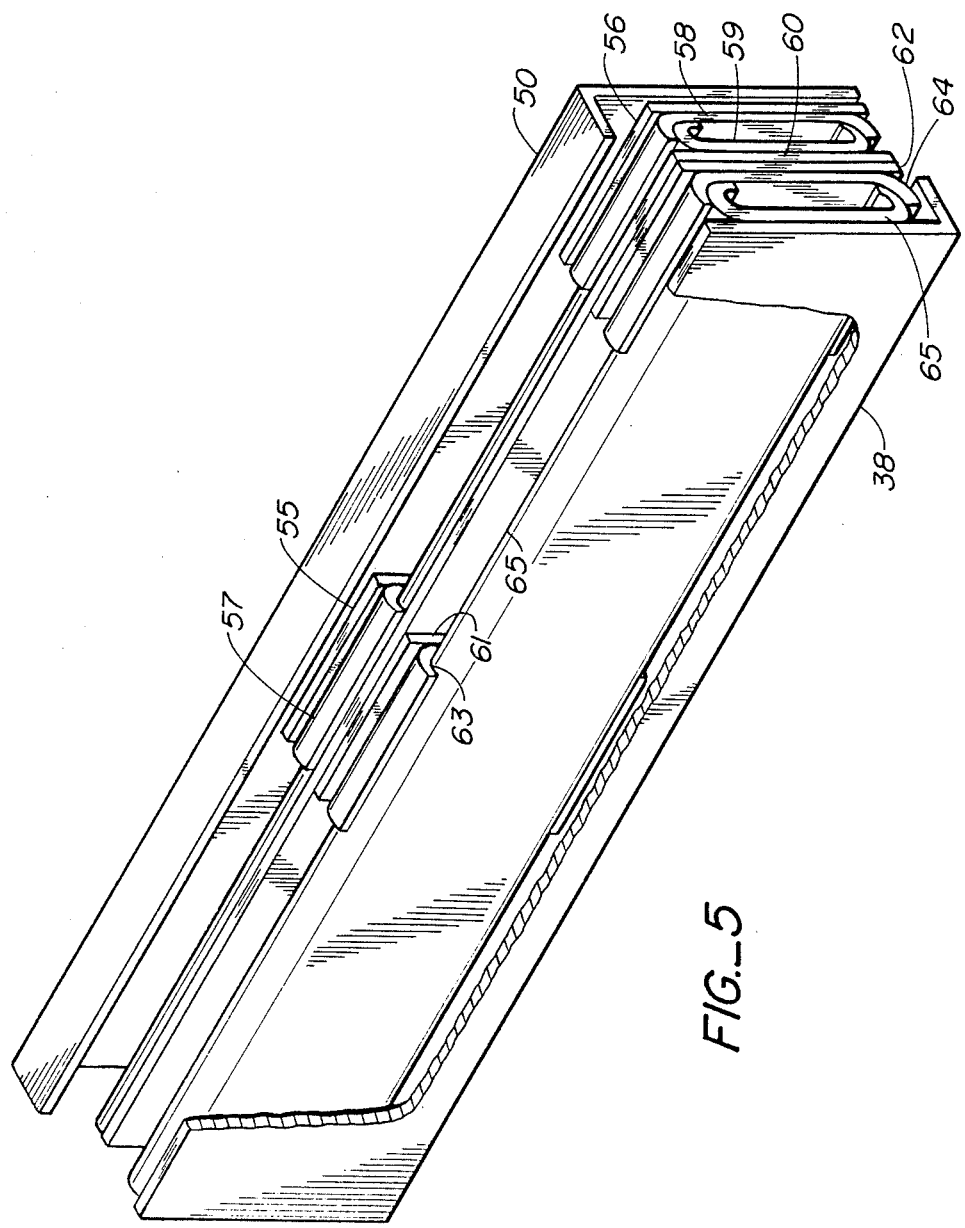
FIG._5

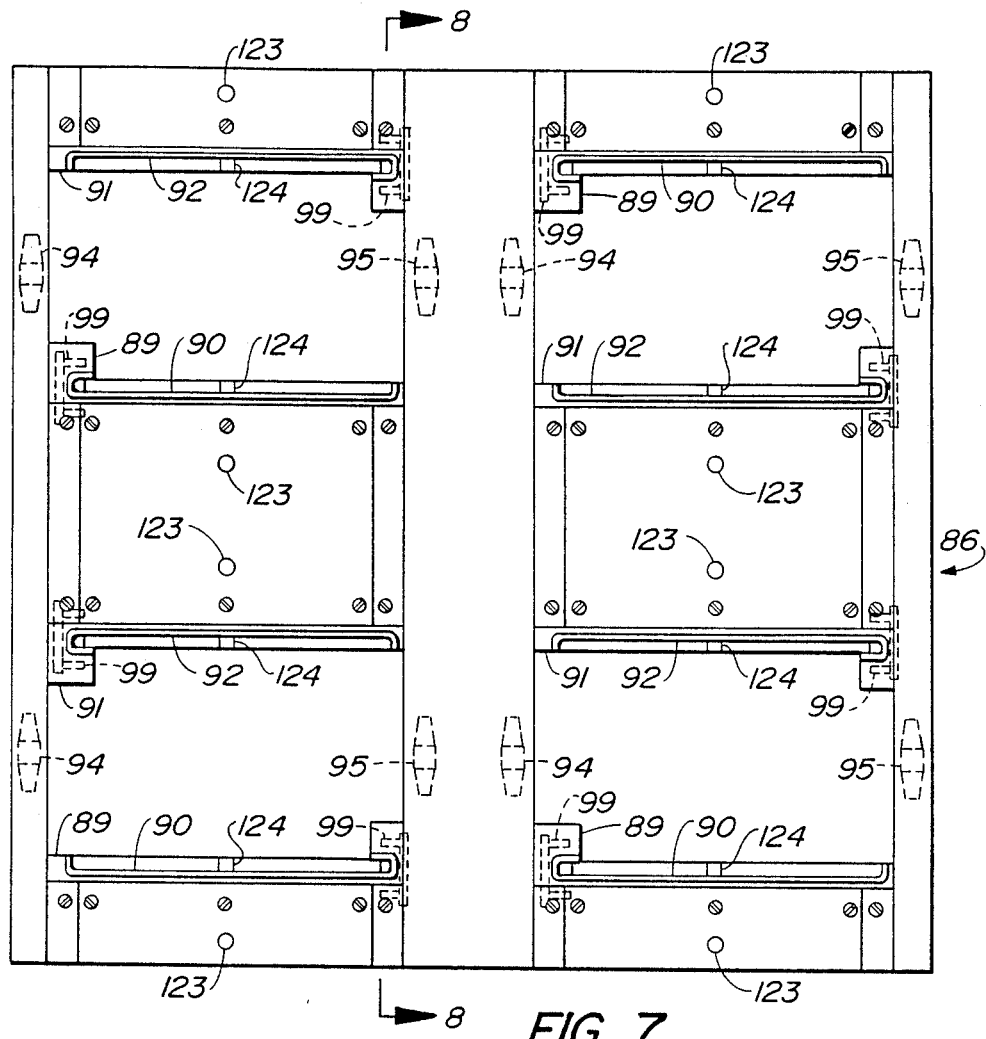
FIG._7
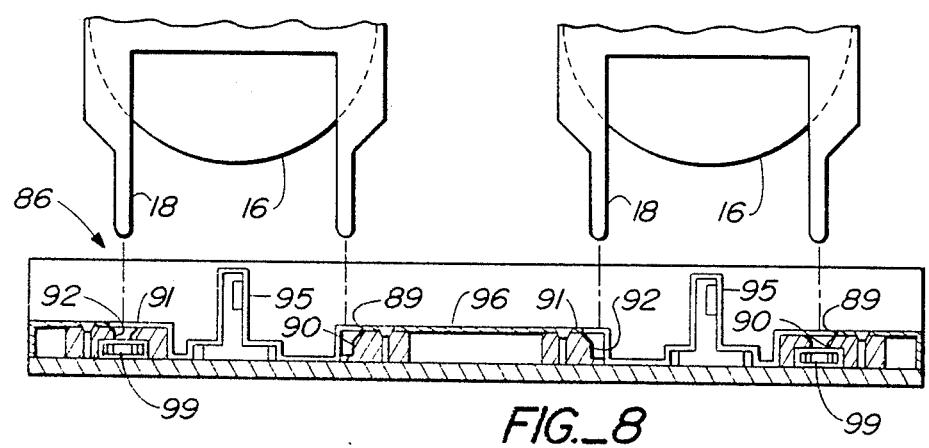
FIG._8

SEMICONDUCTOR WAFER CARRIER INPUT/OUTPUT DRAWER

This invention relates to the handling of semiconductor wafer carriers and, more particularly, to the transfer of carriers to and from automated apparatus.

Wafers are normally carried between wafer fabrication steps in plastic cassettes such as those manufactured by Floroware, Inc. of Chaska, Minn. (see, e.g., U.S. Pat. No. 3,961,877). There are several others commercially used. The cassettes are manually or semiautomatically put onto (or taken from) loading stations serving, e.g., wafer alignment devices or transfer devices such as those manufactured by Micro Glass, Inc. of East Syracuse, N.Y. (see, e.g., U.S. Pat. No. 4,573,851). Although, as these patents and other literature in the semiconductor fabrication art indicate, there is an ever increasing demand for faster, cleaner and safer processing which has led to more extensive automation of the processing steps, the art has not fully appreciated the importance of handling cassettes around such loading stations in the same way. Humans at rest generate hundreds of thousands of microscopic particles every minute and only mild exertion increases the rate to millions of such particles/minute. Also, humans must be protected from operating machinery when both are working in the same vicinity. Thus, the atmosphere around loading stations is unnecessarily contaminated by airborne particles and the loading station cannot most efficiently serve the equipment with which it is associated.

The loading station of the present invention permits human operators to quickly and safely load (and unload) wafer-ladened carriers with almost no exertion while, e.g., wafer aligners, automatic transporting devices such as microprocessor-controlled elevators and the like are operating. Typical of such elevators are the cartesian coordinate (or "XYZ") elevators provided by Wollmann Engineering, Inc. of Tempe, Ariz. Accordingly, the present invention provides an input/output drawer which is extendable from a frame to an open position where carriers are loaded in (or unloaded from) the drawer and retractable to a closed position within the frame where carriers are automatically loaded in (or unloaded from) the drawer. In the preferred embodiment to be described later, a frame has at least two vertically stacked drawers so that a drawer in the extended open position can be loaded (or unloaded) while another drawer in the closed position in the frame can be simultaneously loaded (or unloaded) by, e.g., a microprocessor-controlled elevator. Preferably, the drawers have front and rear walls in front of and behind wafer carrier supports so that wafers in closed drawers can be isolated from the general atmosphere surrounding an opened drawer where human operators are active and/or airborne particles are being generated by, e.g., wafers vibrating in their carriers as the carriers are being loaded (or unloaded).

Other details, objects and advantages of the invention will become apparent as the following description of a presently preferred embodiment thereof proceeds. The preferred embodiment described below is used in connection with a vertical stack of four horizontal quartz tubes in a CVD furnace serviced by boat loaders such as, e.g., the apparatus disclosed in U.S. Pat. No. 4,543,059. Because of the very high processing temperatures in CVD furnaces, the wafers in plastic carriers (which typically hold 25 wafers) must be first transported to a wafer transfer machine for transfer to quartz carriers (or "boats") which are then transported onto the boat loaders which in turn transport the wafers into the horizontal tubes (which typically handle 200 wafers during processing). Thus, each drawer preferably has sufficient capacity to hold eight, 25-wafer cassettes.

In the accompanying drawings, the preferred embodiment of the invention is shown in which:

FIG. 1 is a partial perspective schematic of a vertical stack of four input/output drawers embodying the invention;

FIG. 2 is a plan view of the drawer 46 of FIG. 1;

FIG. 3 a sectional view of the drawer 46 of FIG. 2 taken along line III—III;

FIG. 4 a partial end view of the drawer 46 of FIG. 2 taken along line IV—IV showing the slide means in the retracted position;

FIG. 5 a partial perspective view of the drawer 46 of FIG. 2 taken along line V—V showing the slide means 54;

FIG. 6 is a schematic representation of the slide means of FIG. 5 in the extended position;

FIG. 7 is a plan view of a carrier support of FIG. 2; and

FIG. 8 a sectional view of the carrier support of FIG. 7 taken along line VIII—VIII.

FIG. 1 shows a cabinet 30 having four vertically stacked input/output drawers 42, 44, 46 and 48 behind an automatic loading (or unloading) device such as a programmable XYZ elevator 20. The drawers may have electronic displays 49 tied into a controlling microprocessor for indicating, e.g., whether a drawer is in service or the next time the drawer is opened. Because the drawers are identical, only representative drawer 46 is shown and described in detail.

The illustrated elevator 20 rides on a single wheel (not shown) on a single rail 21 which extends (in the "X" direction) along the open side 32 of the cabinet 30 from its front side 31 to another device such as a wafer aligner or a wafer transfer machine (not shown) located beyond the rear 33 of the cabinet 30. The elevator 20 is drivingly guided on twin parallel rails 22 by linear bushings (not shown) in housing 26. An arm 24 moves vertically (in the "Y" direction) along a track 23 of elevator 20. The arm 24 is moveable in the third orthogonal (or "Z") direction so that a pickup tool 25 on the end of the arm 24 can advance toward or retract from, e.g., the drawer 46 of the cabinet 30 for transferring carriers 16 ladened with wafers 18 onto or from the inclined wafer carrier supports 86, 86. Up to eight carriers 16 can nest on the supports 86, 86.

The drawer 46 extends on slide means 54, 54 disposed on either side of the carrier supports 86, 86 to an open position beyond the front 31 of the cabinet 30, where the carriers 16 can be manually, semiautomatically or automatically loaded on (or unloaded from) carrier supports 86, 86 in the drawer. Drawer 44 illustrates a partially opened drawer and shows a portion of the drawer drive system 100 behind it. The drawers preferably extend beyond the front 31 of the cabinet to such an extent that each of the carriers is beyond the working area of arm 24 of the elevator 20 to permit loading (or unloading) of an open drawer free of the automatic elevator 20 while it is operating anywhere along the rail 21.

FIGS. 2 and 3 generally show a drawer 46 in the closed position in the cabinet 30 without any carriers nested on supports 86 and 86. The drawer 46 is slidably supported by a frame structure 36 generally comprising vertical members 37, longitudinal members 38 and cross members 39. The frame 36 also supports other portions of the cabinet 30, including fairing 40 along the front side 31, an internal side wall 34, an internal rear wall 41, and a top 35, for controlling the flow of air around the cabinet 30, as will be explained below.

The drawer 46 has a front wall 70 and a rear wall 76 supported by depending longitudinal channel members 50, 50 and cross channel members 51, 52 and 53, which walls are disposed in front of and behind, respectively, two identical carrier supports 86, 86. Soft rubber (such as neoprene extrusions or the like) seals 71 are fastened to the sides and top of the front wall 70 of the drawer 46 for engaging soft rubber seals 72 fastened to the fairing 40 or other member of the cabinet 30, and soft rubber seals 77 are fastened to the sides and top of the rear wall 56 of the drawer 46 for engaging soft rubber seals 78 fastened to the inner rear wall 41, when the drawer 46 is closed. When the drawer 46 is opened, the seals 77 on the rear wall 76 of the drawer 46 engage the seals 72 mounted on the front fairing 40. A small clearance of less than a tenth of an inch between the bottom of the closed drawer 46 permits only a very small amount of air leakage into the cabinet 30. There is considerably more leakage under an open drawer 44 into the cabinet. However, an exhaust system (not shown) located behind the internal back wall 34 in communication with the portion of the cabinet behind the internal rear wall 41 draws the air which leaks into the cabinet 30 through the space under the carrier supports 86, 86 and then into the space behind the internal back rear wall 41. Thus, literally hundreds of wafers can be held in in-process storage at a loading station without being contaminated by human operators in the vicinity.

The drawer 46 is operated by a pulley system 100 (best shown by FIG. 3) which is reciprocably operated by a microprocessor. A pulley belt 102 clamped between a rear plate 97 fastened behind the drawer rear cross member 53 and a cooperating under-plate 98 having teeth (not shown) for operatively engaging the teeth of the pulley belt 102 is driven back and forth between a front idler pulley 104 and a rear drive pulley 111 by a motor 114 (through coupler 113). The front pulley 104 is journalled in a bracket 106 fastened to the cabinet front cross member 39. The rear pulley is journalled in bracket 112 and the motor 114 is supported by bracket 115, both of which brackets are fastened to a cabinet rear cross member 39. Two mechanical stops 81 are mounted on the drawer rear cross member 53 for engaging stop pads 82 mounted to the drawer rear cross member 39 when the drawer 46 is in the closed position. The circuitry for operating the drawer 46 includes a potentiometer 120 supported by bracket 121 coupled to the rear pulley wheel 111 for sensing the position of the drawer 46 through the rotation of the rear pulley wheel 111, and also a contact arm 84 mounted on the drawer rear cross member 53 for engaging limit switch contact pin 85 mounted to the frame 36 when the drawer 46 is closed.

The drawer slide means 54, 54 are best seen in FIGS. 4, 5 and 6. Each mechanism is actually a double slide operating in parallel so that the moving slide members do not project beyond the profile of the drawer at any time. Longitudinal drawer channels 50, 50 support front brackets 55, 55 and rear brackets 56, 56 on which are fixedly mounted front slides 57, 57 and rear slides 58, 58.

Each pair of drawer slides 57, 58 slide along one of two guideway 59, 59 fastened to the inner faces of adapters 60, 60. A second pair of front brackets 61, 61 and rear brackets 62, 62 are fixedly mounted on the outer faces of the adapter plates 60, 60 for supporting front slides 63, 63 and rear slides 64, 64. Each pair of adapter slides 63, 64 slide along one of two rails 65 fixedly mounted to longitudinal structural member 38 of the cabinet 30. FIG. 5 generally illustrates the relative position of the slide means 54 when the drawer 46 is closed. FIG. 6 generally illustrates the relative positions of the drawer slides 57, 58 and the adapter slides 63, 64 when the drawer 46 is open.

The plastic cassettes 16 must be accurately nested on carrier supports 86, 86 (one of which is shown in detail in FIGS. 7 and 8) of the drawer 46 so that the fork 25 on elevator arm 24 can handle them without damaging the wafers. Thus, each carrier support 86 has an inclined (at about 3° to 5°) supporting surface 87 supported on legs 88 (FIG. 3) fastened to the drawer cross channels 52 for nesting up to four carriers. The slight inclination tilts the carriers which causes the wafers (which are placed in the drawers with their faces generally perpendicular to the direction of the drawer travel) to rest against one wafer face and not to vibrate between the wafer supports in the carrier. Each nest has a pair of blocks 89, 91 having walls 90 and 92, respectively, for receiving the legs of the cassettes 16 and locating the carriers 16 in their nests.

The nest blocks 89 and 91 each contain a registration key 124 which projects above the landing surface for the cassette leg. This key 124 is configured to match a standard notch in the cassette leg located on the cassette centerline. Since the cassette leg is not symmetrical about the cassette centerline, the registration key 124 may prevent the cassette from nesting properly if the cassette is loaded 180° out of proper orientation.

Circuitry for sensing proper nesting of the cassettes 16 includes a pair of standard photo sensors 94, 94 located on diagonal corners of the nest and a conveniently located LED display on, e.g., the front drawer wall (not shown) where the operator easily sees it. A shroud 96 covers the inclined surface 87, blocks 89 and 91 and the photocells 94 and 95.

Circuitry for sensing wafer presence includes photo-emitter 94 and photo-receiver 95, located on the cassette centerline and elevated to "see" the wafers as they project down under the endwall of the cassette.

An LED 123 at each nest, driven by the system computer program may assist the operator in proper placement of the cassette in the nest.

Thus, in the operation of the loading station, a microprocessor (controlled by a host computer also controlling an elevator) controls a drawer in a cabinet containing several drawers. The drawer can be opened at an optimum time and loaded or unloaded while a closed drawer is being loaded or unloaded by the elevator and the other closed drawers are storing in-process wafers to most efficiently use the equipment served by the loading station. The operator cannot be injured by a moving elevator because he loads and unloads from the side. System thruput is increased because the elevators do not have to stop when the elevators load and unload. Also, contaminating particles generated during the loading or unloading operation do not contaminate the stored wafers in the station.

While a presently preferred embodiment of the invention has been described and illustrated, it is to be distinctly understood that the invention is not limited thereto but may be otherwise variously embodied within the scope of the following claims.

What is claimed is:

1. A semiconductor wafer carrier input/output drawer adapted to be moveably supported by a frame and to be extendable to an open position beyond the frame where carriers are loaded in or unloaded from the drawer and retractable to a closed position within the frame where carriers are automatically loaded in or unloaded from the drawer, wherein the drawer has a carrier support surface for supporting carriers containing wafers, the wafers having a face and a peripheral edge, and the carrier support surface is disposed in a horizontally inclined plane whereby a face of the wafers rest against the carriers.

2. A semiconductor wafer carrier input/output drawer of claim 1 wherein the drawer has a front wall and wherein the carrier support surface has nests for maintaining the wafer faces in spaced parallel relation with each other and with the front wall.

3. A semiconductor wafer carrier input/output station comprising a frame and at last two drawers vertically stacked in the frame, the drawers being extendable to an open position beyond the frame where carriers are loaded in or unloaded from the drawers and retractable to a closed position within the frame where carriers are automatically loaded in or unloaded from the drawers, wherein each drawer has a wafer carrier support surface, a front wall and a rear wall disposed in front of and behind a wafer carrier support surface, respectively, and at least one side of each drawer is wall-less above the carrier support surface, and further comprising a cabinet supported by the frame, said cabinet having a front wall and having a wall-less side adjacent to a wall-less side of the drawers.

4. A semiconductor wafer carrier input/output station comprising a frame and at last two drawers vertically stacked in the frame, the drawers being extendable to an open position beyond the frame where carriers are loaded in or unloaded from the drawers and retractable to a closed position within the frame where carriers are automatically loaded in or unloaded from the drawers, wherein each drawer has a wafer carrier support surface, a front wall and a rear wall disposed in front of and behind a wafer carrier support surface, respectively, and at least one side of each drawer is wall-less above the carrier support surface, wherein the drawer has a carrier support surface, and the drawer is movably supported by the frame below the carrier support surface and is reciprocally driven by a pulley system located below the carrier support surface.

5. A semiconductor wafer carrier input/output station comprising a frame and at last two drawers vertically stacked in the frame, the drawers being extendable to an open position beyond the frame where carriers are loaded in or unloaded from the drawers and retractable to a closed position within the frame where carriers are automatically loaded in or unloaded from the drawers, wherein each drawer has a wafer carrier support surface, a front wall and a rear wall disposed in front of and behind a wafer carrier support surface, respectively, and at least one side of each drawer is wall-less above the carrier support surface, and further comprising a cabinet supported by the frame, said cabinet having a front wall, wherein the front wall and rear wall of each drawer have seals along their top and side periphery for engaging the front wall of the cabinet when the drawer is in the closed position, respectively, and wherein the cabinet has a clearance between its front wall and the bottom periphery of the drawer front wall.

* * * * *